US011909402B2

(12) United States Patent
Ranucci et al.

(10) Patent No.: US 11,909,402 B2
(45) Date of Patent: Feb. 20, 2024

(54) SEMICONDUCTOR DEVICE INCLUDING A PULSE AMPLITUDE MODULATION DRIVER

(71) Applicant: Taiwan Semiconductor Manufacturing Company, Ltd., Hsinchu (TW)

(72) Inventors: Paul Ranucci, Leander, TX (US); Alan Roth, Leander, TX (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/847,307

(22) Filed: Jun. 23, 2022

(65) Prior Publication Data

US 2023/0268912 A1    Aug. 24, 2023

Related U.S. Application Data

(60) Provisional application No. 63/312,417, filed on Feb. 22, 2022.

(51) Int. Cl.
*H03K 17/00* (2006.01)
*H03K 7/02* (2006.01)
*H03K 17/687* (2006.01)

(52) U.S. Cl.
CPC ............. *H03K 7/02* (2013.01); *H03K 17/687* (2013.01); *H03K 17/6872* (2013.01); *H03K 17/6874* (2013.01)

(58) Field of Classification Search
CPC .. H03K 7/02; H03K 17/6872; H03K 17/6874; H04L 25/4917
See application file for complete search history.

(56) References Cited

U.S. PATENT DOCUMENTS

| | | | |
|---|---|---|---|
| 9,746,864 B1* | 8/2017 | Narang | G05F 1/56 |
| 9,853,642 B1* | 12/2017 | Tan | H03M 9/00 |
| 11,245,555 B1 | 2/2022 | Delshadpour | |
| 11,587,598 B2* | 2/2023 | Um | G11C 7/1084 |
| 2004/0019743 A1 | 1/2004 | Mario et al. | |
| 2005/0206602 A1* | 9/2005 | Kojima | G09G 3/3696 345/96 |
| 2014/0125380 A1 | 5/2014 | Bhuiyan | |
| 2017/0222845 A1 | 8/2017 | Zerbe et al. | |
| 2018/0102797 A1* | 4/2018 | Lim | H03K 19/0175 |
| 2019/0253044 A1* | 8/2019 | Kim | H03K 7/02 |
| 2021/0312957 A1 | 10/2021 | Okabe | |

OTHER PUBLICATIONS

Taiwan Office Action; Application No. 111146745; dated Jul. 5, 2023.

* cited by examiner

*Primary Examiner* — Tuan T Lam
(74) *Attorney, Agent, or Firm* — Jones Day

(57) ABSTRACT

Devices and methods are described herein for a pulse amplitude modulation (PAM) driver. In one embodiment, the PAM driver includes a first high-speed buffer configured to output a first voltage, a second high-speed buffer configured to output a second voltage, and a plurality of transistors coupled to the first high-speed buffer and the second high-speed buffer. At least one of the first voltage or the second voltage facilitates selective operation of a transistor of the plurality of transistors to output a third voltage.

20 Claims, 9 Drawing Sheets

| | Output | Code | A | B | C | D | ON switch |
|---|---|---|---|---|---|---|---|
| 295A | 0 | 00 | H | L | H | H | M1 |
| 295B | 1/3VDD | 01 | H | H | H | L | M2 |
| 295C | 2/3VDD | 10 | L | L | H | L | M3 |
| 295D | VDD | 11 | H | L | L | L | M4 |

| Current Word | | Next Word | | di/dt Transition | |
| --- | --- | --- | --- | --- | --- |
| MSB | LSB | MSB | LSB | LD02 | LD01 |
| 0 | 0 | 0 | 0 | 0 | 0 |
| 0 | 0 | 0 | 1 | 0 | 1 |
| 0 | 0 | 1 | 0 | 1 | 0 |
| 0 | 0 | 1 | 1 | 0 | 0 |
| 0 | 1 | 0 | 0 | 0 | 0 |
| 0 | 1 | 0 | 1 | 0 | 0 |
| 0 | 1 | 1 | 0 | 1 | 0 |
| 0 | 1 | 1 | 1 | 0 | 0 |
| 1 | 0 | 0 | 0 | 0 | 0 |
| 1 | 0 | 0 | 1 | 0 | 1 |
| 1 | 0 | 1 | 0 | 0 | 0 |
| 1 | 0 | 1 | 1 | 0 | 0 |
| 1 | 1 | 0 | 0 | 0 | 0 |
| 1 | 1 | 0 | 1 | 0 | 1 |
| 1 | 1 | 1 | 0 | 1 | 0 |
| 1 | 1 | 1 | 1 | 0 | 0 |

FIG. 8

SEMICONDUCTOR DEVICE INCLUDING A PULSE AMPLITUDE MODULATION DRIVER

PRIORITY CLAIM

This application claims priority to U.S. Provisional Application No. 63/312,417, filed Feb. 22, 2022, the contents of which are incorporated herein by reference in its entirety.

BACKGROUND

Most electronics today rely upon semiconductor devices or chips to operate. Semiconductor chips can often be made up of a number of integrated circuits (IC). These integrated circuits can be divided into multi-die function circuit blocks, or chiplets, each of which perform a given function. The popularity of multi-die chiplet based computer processing units (CPUs) has led to a growing need for low-power high-speed die-to-die communication methods. Pulse Amplitude Modulation (PAM) is an example communication method that can be used for communicating between chiplets.

BRIEF DESCRIPTION OF THE DRAWINGS

Aspects of the present disclosure are best understood from the following detailed description when read with the accompanying figures:

FIG. 8 is a truth table 800 illustrating based on the current data word and the previous data word in accordance with various embodiments of the present disclosure.

DETAILED DESCRIPTION

Figure 1:
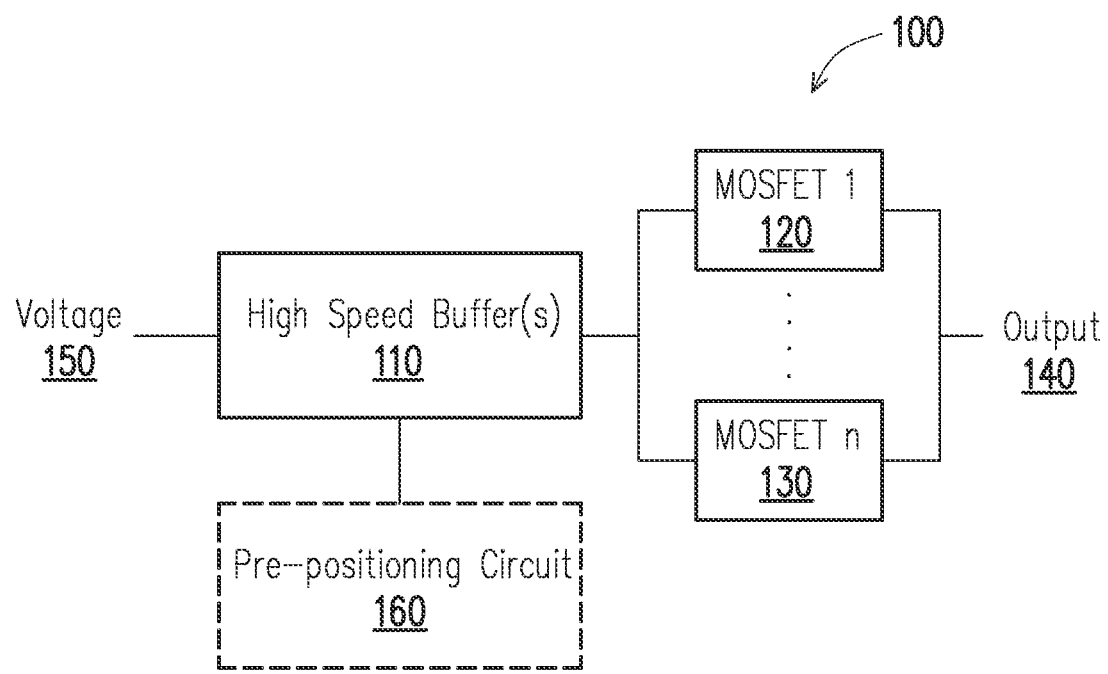
FIG. 1 is a block diagram illustrating an exemplary semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor chips can often be made up of a number of integrated circuits (IC). These ICs can be divided into multi-die function circuit blocks, or chiplets, each of which perform a given function. Each chiplet performs its function based a series of signals (or pulses). Pulse Amplitude Modulation (PAM) is an example communication method that can be used for transmitting a series of signals between chiplets. In other words, PAM is a way that data can be communicated internally on a semiconductor chip between chiplets. Data is transmitted using PAM by varying an amplitude (e.g., voltage or power levels) of individual pulses within an electrical signal. This data can be transmitted, for example, over electrical or optical links, also known as channels, between the chiplets. Each chiplet can have an associated bandwidth that determines how much information it can send or receive. Increasing the bandwidth of a chiplet allows for more information to be sent or received by the chiplet. Sometimes increasing bandwidth of a chiplet can come at a cost of needing additional power (e.g., more current or voltage) to operate the chiplet.

There are various types of PAM including, but not limited to, 4-level PAM (PAM-4), 8-level PAM (PAM-8), and 16-level (PAM-16). Consider, for example, PAM-4. Most PAM-4 implementations use a small number of channels to communicate, with the electrical signal having relatively high power sent at high-speeds. Electrical circuits using PAM-4 transmit data over a channel in four signal levels or signal states, e.g., 00, 01, 10, and 11. Signal states 01 and 10 are known as mid-level states. Electrical circuits that use PAM-4 can have an inherent direct current (DC) current in mid-level states (e.g., 01, 10), which may prevent use in electrical circuits having a large number of channels and/or slower transmission interfaces. Despite its high-power needs, PAM-4 may be an attractive signal modulation method for increasing bandwidth. For example, the signal 101100100100 can be transmitted using PAM-4 in half the time as compared to the same signal being transmitted only in two signal levels, i.e., 0 or 1. The semiconductor devices described herein are PAM devices that can operate at low power as the inherent DC current in mid-level states is eliminated.

FIG. 1 is a block diagram illustrating an exemplary semiconductor device 100 in accordance with various embodiments of the present disclosure. The semiconductor device 100 uses one or more high-speed buffers 110 to drive mid-level state voltages of a plurality of metal oxide semiconductor field effect transistor (MOSFET) (e.g., MOSFET 1 120 through MOSFET n 130) depending on the level of PAM communication. The plurality of MOSFETs can be configured as a "1-hot" analog multiplexer in which one MOSFET is on during a given output state providing a single path between the output and appropriate voltage supply. This could be, for example, the chip supply voltage (e.g., VDD, VSS, GND, etc) or a mid-level voltage formed through reference voltage 150 and high-speed buffer(s) 110. The use of the "1-hot" analog multiplexer (e.g., high-speed buffer(s) 110) reduces or eliminates DC current in any drive state, including the mid-level states of PAM communication signals. The output 140 is the encoded PAM output. The reference voltage 150 driving the high-speed buffer(s) can be, for example, a voltage divider and/or any appropriate voltage reference circuit.

In some embodiments, semiconductor device 100 can include a pre-positioning circuit 160. The pre-positioning circuit 160 pre-positions the output voltage of the high-speed buffer(s) 110 by increasing or decreasing a voltage during the state preceding the transition to the intermediate state (e.g., 01, 10) as described in more detail in FIGS. 4-6.

Figures 2A, 2B:
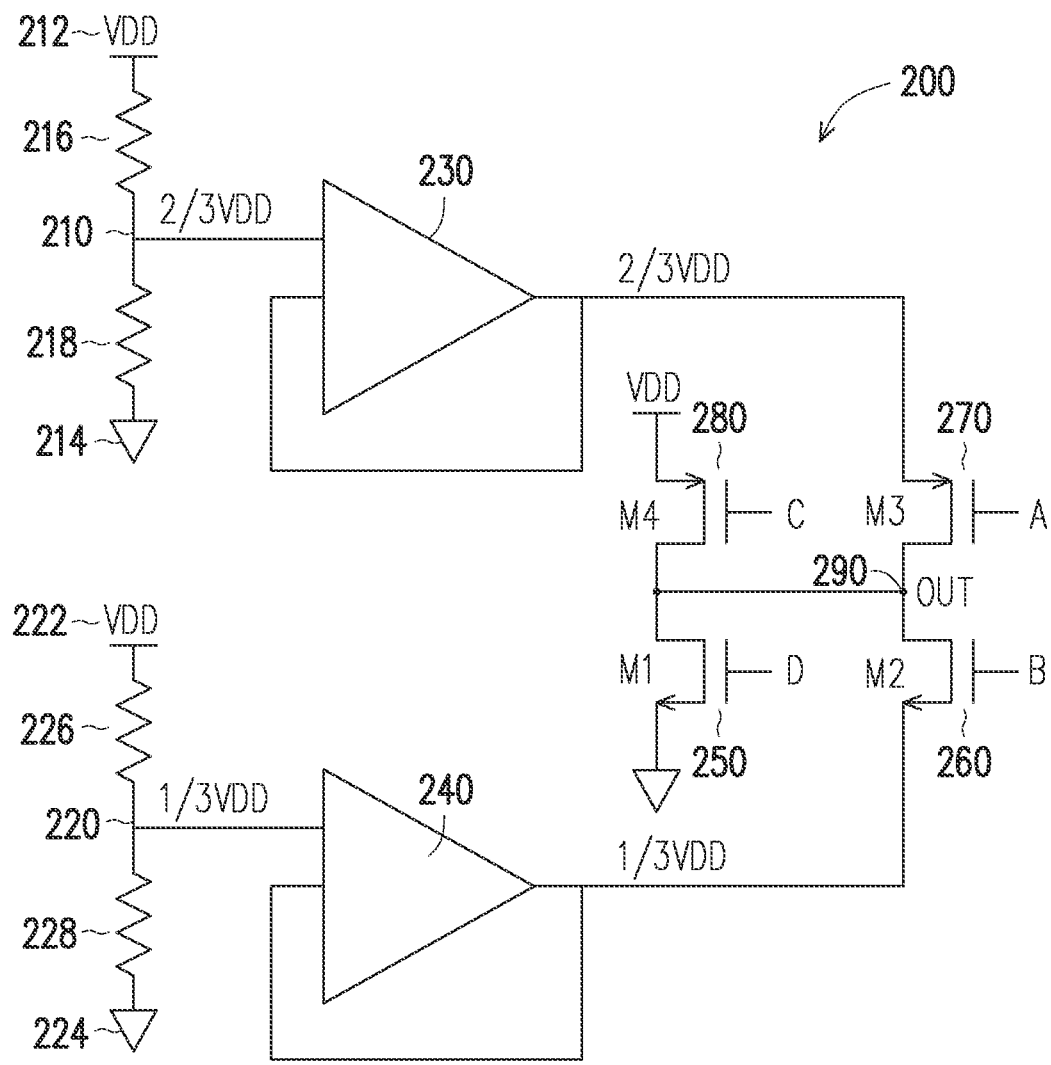
FIG. 2A is a schematic diagram illustrating an exemplary semiconductor device in accordance with various embodiments of the present disclosure.
FIG. 2B is a logic table illustrating a relationship between drive signals and output voltages of the semiconductor device in accordance with various embodiments of the present disclosure.

FIG. 2A is a schematic diagram illustrating an exemplary semiconductor device 200 in accordance with various embodiments of the present disclosure. Semiconductor device 200 is a further detailed illustration of semiconductor device 100 absent a pre-positioning circuit 160. For the purposes of illustration and ease of understanding, the semiconductor device 200 is described as a 2-bit PAM-4 device having a single communication channel (e.g., output 290 (OUT)). However, those skilled in the art can appreciate that semiconductor device 200 can apply to any type of PAM device, including but not limited to PAM-8 or PAM-16. As illustrated in FIG. 2A, semiconductor device 200 includes a pair of reference voltages 210, 220 (e.g., voltage 150), a pair of buffers 230, 240 (e.g., high-speed buffer(s) 110), a pair of N-type metal oxide semiconductor (NMOS) transistors 250, 260 (M1, M2) (e.g., MOSFET 1 120-MOSFET n 130), and a pair of P-type metal oxide semiconductor (PMOS) transistors 270, 280 (M3, M4) (e.g., MOSFET 1 120-MOSFET n 130). In the embodiment illustrated in FIG. 2A, the pair of reference voltages 210, 220 are both in the form of voltage dividers. The semiconductor device 200 is an example "1-hot" analog multiplexer for PAM-4 encoding.

Reference voltage 210 supplies the input to buffer 230. For example, the reference voltage 210 is connected between a first node 212 and a second node 214. The first node 212 is coupled to and receives a supply voltage (VDD). The second node 214 is coupled to an electrical ground. A resistor 216 is coupled between the first node 212 and the reference voltage 210. Another resistor 218 is coupled between the reference voltage 210 and the second node 214. The resistors 216, 218 are appropriately sized such that the reference voltage 210 is configured to provide a voltage (e.g., ⅔VDD) that is approximately two thirds of the supply voltage (VDD) to an input of buffer 230.

Similarly, reference voltage 220 powers buffer 240. For example, the reference voltage 220 is connected between a third node 222 and a fourth node 224. The third node 222 is coupled to and receives a supply voltage (VDD). The fourth node 224 is coupled to an electrical ground. A resistor 226 is coupled between the third node 222 and the reference voltage 220. Another resistor 228 is coupled between the reference voltage 220 and the fourth node 224. The resistors 226, 228 are appropriately sized such that the reference voltage 220 is configured to provide a voltage (e.g., ⅓VDD) that is approximately one third of the supply voltage (VDD) to an input of buffer 240. The reference voltages 210, 220 used by the buffers 240, 230 are, in some embodiments, global reference voltages to a multi-channel device such that a single reference voltage is provided to many different channels. The use of global reference voltages 210,220 facilitates lower power consumption for the semiconductor device 200.

As illustrated in FIG. 2A, buffers 230, 240 are in the form of operational amplifiers. Each buffer 230, 240 (e.g., high-speed buffer(s) 110) are connected to n number of channels, such that the intermediate voltage of each channel is sourced from the respective buffer 230, 240 to which it is connected. The n number of channels can be any number from 1 to L, where L is the total number of channels in a particular group. As an example, if L equals twenty (20), there are twenty (20) unique channels in each group. In the case when n equals one (1), there are twenty (20) individual high-speed buffer(s) 100 for each intermediate level, each corresponding to a single channel. On the other hand, when n equals twenty (20), there is one (1) high-speed buffer 110 for each intermediate level, all twenty (20) channels are sourced from that same high-speed buffer 110.

Buffer 230 has a non-inverting input connected to its reference voltage 210 and an inverting input connected to an output of the buffer 230. Similarly, buffer 240 has a non-inverting input connected to the reference voltage 220 and an inverting input connected to an output of the buffer 240. Each of the NMOS transistors 250, 260 (M1, M2) and PMOS transistors 270, 280 (M3, M4) has a first source/drain terminal coupled to an output node 290 (e.g., output 140). NMOS transistor 250 (M1) has a second source/drain terminal coupled to ground. NMOS transistor 260 (M2) has a second source/drain terminal coupled to the output of buffer 240. Similarly, PMOS transistor 270 (M3) has a second source/drain terminal coupled to an output of buffer 230. PMOS transistor 280 (M4) has a second source/drain terminal coupled to a supply voltage (VDD). In some embodiments, buffers 230, 240 can be shared between multiple channels to allow for averaging of current between the channels.

FIG. 2B is a logic table 295 illustrating a relationship between drive signals and output voltages of the semiconductor device 200 in accordance with various embodiments of the present disclosure. Drive signals (A, B, C, D) are applied to gate terminals of NMOS transistors 250, 260 (M1, M2) and PMOS transistors 270, 280 (M3, M4). Based on these drive signals (A, B, C, D) varying voltages are present at output node 290 such that one of the NMOS transistors 250, 260 (M1, M2) or PMOS transistors 270, 280 (M3, M4) are turned on and the others are turned off, one of the voltages, i.e., zero, ⅓VDD, ⅔VDD, or VDD appears at the output node 290 (OUT). These voltages zero, ⅓VDD, ⅔VDD, and VDD may represent 2-bit PAM-4 data signals 00, 01, 10, and 11, respectively.

Operational PMOS or NMOS transistors act as closed switches, applying voltage from one of the source/drain terminals. PMOS or NMOS transistors that are non-operational act as open switches and no voltage is applied from one of the source/drain terminals. Generally speaking, PMOS transistors are in an "ON" state (e.g., operational) when the voltage applied at the gate terminal is a logic low '0'. NMOS transistors are in an "ON" state (e.g., operational) when the voltage applied to the gate terminal is a logic high '1'.

With reference to the operation of semiconductor device 200 illustrated in FIG. 2A, voltages of varying logic levels are applied to the gate terminals of NMOS transistors 250, 260 (M1, M2) and PMOS transistors 270, 280 (M3, M4). Based on these applied logic levels, the voltage at output node 290 varies as only one of the transistors (e.g., PMOS transistors 270, 280 (M3, M4) and NMOS transistors 250, 260 (M1, M2)) are operational at a given time. For example, scenario 295A of table 295 illustrates a first combination of drive signals applied to the gate terminals of the NMOS transistors 250, 260 (M1, M2) and PMOS transistors 270, 280 (M3, M4). In scenario 295A, a logic high (e.g., '1') voltage is applied to the gate terminal D of NMOS transistor 250 (M1), which in turn renders it operational. In this scenario, all other transistors (e.g., PMOS transistors 270, 280 (M3, M4) and NMOS transistor 260 (M2)) are non-operational. This is because logic high (e.g., '1') voltages are also applied to the gate terminals A, C of PMOS transistors 270, 280 (M3, M4) and a logic low (e.g., '0') voltage is applied to the gate terminal B of NMOS transistor 260 (M2). When PMOS transistors 270, 280 (M3, M4) and NMOS transistor 260 (M2) are all non-operational, they act as open switches. In turn, with the drive signals in scenario 295A, only NMOS transistor 250 (M1) is operational and passes its voltage of ground (e.g., 0V) through to output node 290. The corresponding 2-bit PAM-4 encoding for such a voltage is 00.

Scenario 295B of table 295 illustrates a second combination of drive signals applied to the gate terminals of the NMOS transistors 250, 260 (M1, M2) and PMOS transistors 270, 280 (M3, M4). In scenario 295B, a logic high (e.g., '1') voltage is applied to the gate terminal B of NMOS transistor 260 (M2), which in turn renders it operational. In this scenario, all other transistors (e.g., PMOS transistors 270, 280 (M3, M4) and NMOS transistor 250 (M1)) are non-operational. This is because logic high (e.g., '1') voltages are also applied to the gate terminals A, C of PMOS transistors 270, 280 (M3, M4) and a logic low (e.g., '0') voltage is applied to the gate terminal D of NMOS transistor 250 (M1). When PMOS transistors 270, 280 (M3, M4) and NMOS transistor 250 (M1) are all non-operational, they act as open switches. In turn, with the drive signals in scenario 295B, only NMOS transistor 260 (M2) is operational and passes its voltage of approximately ⅓VDD (e.g., output of buffer 240) through to output node 290. The corresponding 2-bit PAM-4 encoding for such a voltage is 01 (e.g., mid-level state).

This mid-level voltage is a function of VDD, which is alternating current (AC) and because there are no DC components such as resistors, there is no presence of inherent DC current in this mid-level state.

Scenario 295C of table 295 illustrates a third combination of drive signals applied to the gate terminals of the NMOS transistors 250, 260 (M1, M2) and PMOS transistors 270, 280 (M3, M4). In scenario 295C, a logic low (e.g., '0') voltage is applied to the gate terminal A of PMOS transistor 270 (M3), which in turn renders it operational. In this scenario, all other transistors (e.g., PMOS transistor 280 (M4) and NMOS transistors 250, 260 (M1, M2)) are non-operational. This is because logic low (e.g., '0') voltages are also applied to the gate terminals B, D of NMOS transistors 250, 260 (M1, M2) and a logic high (e.g., '1') voltage is applied to the gate terminal C of PMOS transistor 280 (M4). When PMOS transistor 280 (M4) and NMOS transistors 250, 260 (M1, M2) are all non-operational, they act as open switches. In turn, with the drive signals in scenario 295C, only PMOS transistor 290 (M3) is operational and passes its voltage of approximately ⅔VDD (e.g., output of buffer 230) through to output node 290. The corresponding 2-bit PAM-4 encoding for such a voltage is 10 (e.g., mid-level state). This mid-level voltage is a function of VDD, which is AC current and because there are no DC components such as resistors, there is no presence of inherent DC current in this mid-level state.

Scenario 295D of table 295 illustrates a fourth combination of drive signals applied to the gate terminals of the NMOS transistors 250, 260 (M1, M2) and PMOS transistors 270, 280 (M3, M4). In scenario 295D, a logic low (e.g., '0') voltage is applied to the gate terminal C of PMOS transistor 280 (M4), which in turn renders it operational. In this scenario, all other transistors (e.g., PMOS transistor 270 (M3) and NMOS transistors 250, 260 (M1, M2)) are non-operational. This is because a logic high (e.g., '1') voltage is applied to the gate terminal A of PMOS transistor 270 (M3) and logic low (e.g., '0') voltages are applied to the gate terminals B, D of NMOS transistors 250, 260 (M1, M2). When PMOS transistor 270 (M3) and NMOS transistors 250, 260 (M1, M2) are all non-operational, they act as open switches. In turn, with the drive signals in scenario 295D, only PMOS transistor 280 (M4) is operational and passes its voltage of VDD (e.g., reference voltage) through to output node 290. The corresponding 2-bit PAM-4 encoding for such a voltage is 11.

Figures 3A, 3B:
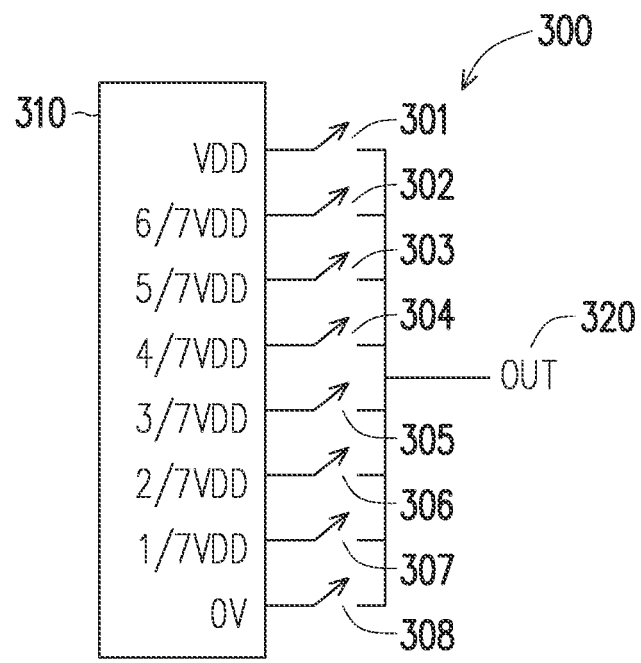
FIG. 3A is a block diagram illustrating an exemplary pre-positioning circuit in accordance with various embodiments of the present disclosure.
FIG. 3B illustrates a logic table defining operations of the pre-positioning circuit in accordance with various embodiments of the present disclosure.

FIG. 3A is a block diagram illustrating an exemplary pre-positioning circuit 300 in accordance with various embodiments of the present disclosure. Pre-positioning circuit 300 can be a PAM-8 circuit. Pre-positioning circuit 300, in some embodiments, can integrated into a semiconductor device such as optionally pre-positioning circuit 160 that can be integrated within semiconductor device 100. Pre-positioning circuit 300 (e.g., pre-positioning circuit 160 in FIG. 1) pre-positions an output of the buffer (e.g., high-speed buffer(s) 110) by increasing or decreasing a voltage during the state preceding the transition to the intermediate state. For example, if the semiconductor device 100 will transition from a lower voltage, e.g., state 00 (VSS), to a higher voltage, e.g., state 10 (⅔VDD), the pre-positioning circuit 300 will increase the reference voltage (VSS) of the buffer (e.g., high-speed buffer(s) 110 to the voltage (⅔VDD) while the output (e.g., output 140) of the semiconductor device 100 is still in the 00 state. Likewise, if the semiconductor device 100 will transition from a higher voltage, e.g., state 11 (VDD) to, a lower voltage, e.g., state 01 (⅓VDD), the pre-positioning circuit 300 will decrease the reference voltage (VDD) of the buffer (e.g., high-speed buffer(s) 110) to the voltage (⅓VDD), while the output of the semiconductor device 100 (e.g., output 140) is still in the 11 state. This may reduce current and/or voltage transients on the ⅔VDD and ⅓VDD outputs by compensating for current and resistance (IR) drops and resistance and capictance (RC) charge times through the output drive MOSFETs in the multiplexer. When the semiconductor device 100 transitions to between states, for example ten states, the output voltage may fall less than if the pre-positioning circuitry 160, 300 were not there. Reducing the voltage transients on the ⅔VDD and ⅓VDD outputs means less variability on the semiconductor device 100 output waveform and a wider vertical eye-margin. In order to implement the pre-positioning circuit 160, 300, logic which indicates the current state and the next state is utilized and decoded into three different pre-positioning states per buffer (e.g., high-speed buffer(s) 110) to indicate whether the reference is adjusted up or down and at what strength. Such logic is illustrated and described in FIG. 5.

As illustrated in FIG. 3A, pre-positioning circuit 300 can include a multiplexer 310 coupled to a plurality of transistors 301, 302, 303, 304, 305, 306, 307, 308. Multiplexer 310 can be a "1-hot" encoded analog multiplexer supplied with any number of voltage supplies. For solely the purpose of illustration and each of understanding, multiplexer 310 is illustrated as an 8:1 multiplexer with a 3-bit PAM-8 output. One of ordinary skill in the art can appreciate, however, that any type of multiplexer and/or PAM output can be implemented as pre-positioning circuit 300. Transistors 301, 302, 303, 304, 305, 306, 307, 308 are illustrated in FIG. 3A as single pole single throw switches for the purpose of illustration and ease of understanding. Transistors 301, 302, 303, 304, 305, 306, 307, 308 can be either NMOS transistors, PMOS transistors, or a combination thereof. With multiplexer 310, only one transistor is operational at a time, supplying its voltage as the output 320 (e.g., output of high-speed buffer(s) 110).

FIG. 3B illustrates a logic table 350 defining operations of the pre-positioning circuit 300 in accordance with various embodiments of the present disclosure. In scenario 351, when transistor 308 is operational it acts as a closed switch and a voltage of approximately 0 is supplied to the output 320, which corresponds to a 3-bit PAM-8 output of '000'. In scenario 352, when transistor 307 is operational it acts as a closed switch and a voltage of approximately ⅐VDD is supplied to the output 320, which corresponds to a 3-bit PAM-8 output of '001'. In scenario 353, when transistor 306 is operational it acts as a closed switch and a voltage of approximately ²⁄₇VDD is supplied to the output 320, which corresponds to a 3-bit PAM-8 output of '010'. In scenario 354, when transistor 305 is operational it acts as a closed switch and a voltage of approximately ³⁄₇VDD is supplied to the output 320, which corresponds to a 3-bit PAM-8 output of '011'. In scenario 355, when transistor 304 is operational it acts as a closed switch and a voltage of approximately ⁴⁄₇VDD is supplied to the output 320, which corresponds to a 3-bit PAM-8 output of '100'. In scenario 356, when transistor 303 is operational it acts as a closed switch and a voltage of approximately ⁵⁄₇VDD is supplied to the output 320, which corresponds to a 3-bit PAM-8 output of '101'. In scenario 357, when transistor 302 is operational it acts as a closed switch and a voltage of approximately ⁶⁄₇VDD is supplied to the output 320, which corresponds to a 3-bit PAM-8 output of high speed buffer 110. In scenario 358, when transistor 301 is operational it acts as a closed switch and a voltage of approximately VDD is supplied to the output 320, which corresponds to a 3-bit PAM-8 output of '111'.

Figure 4:
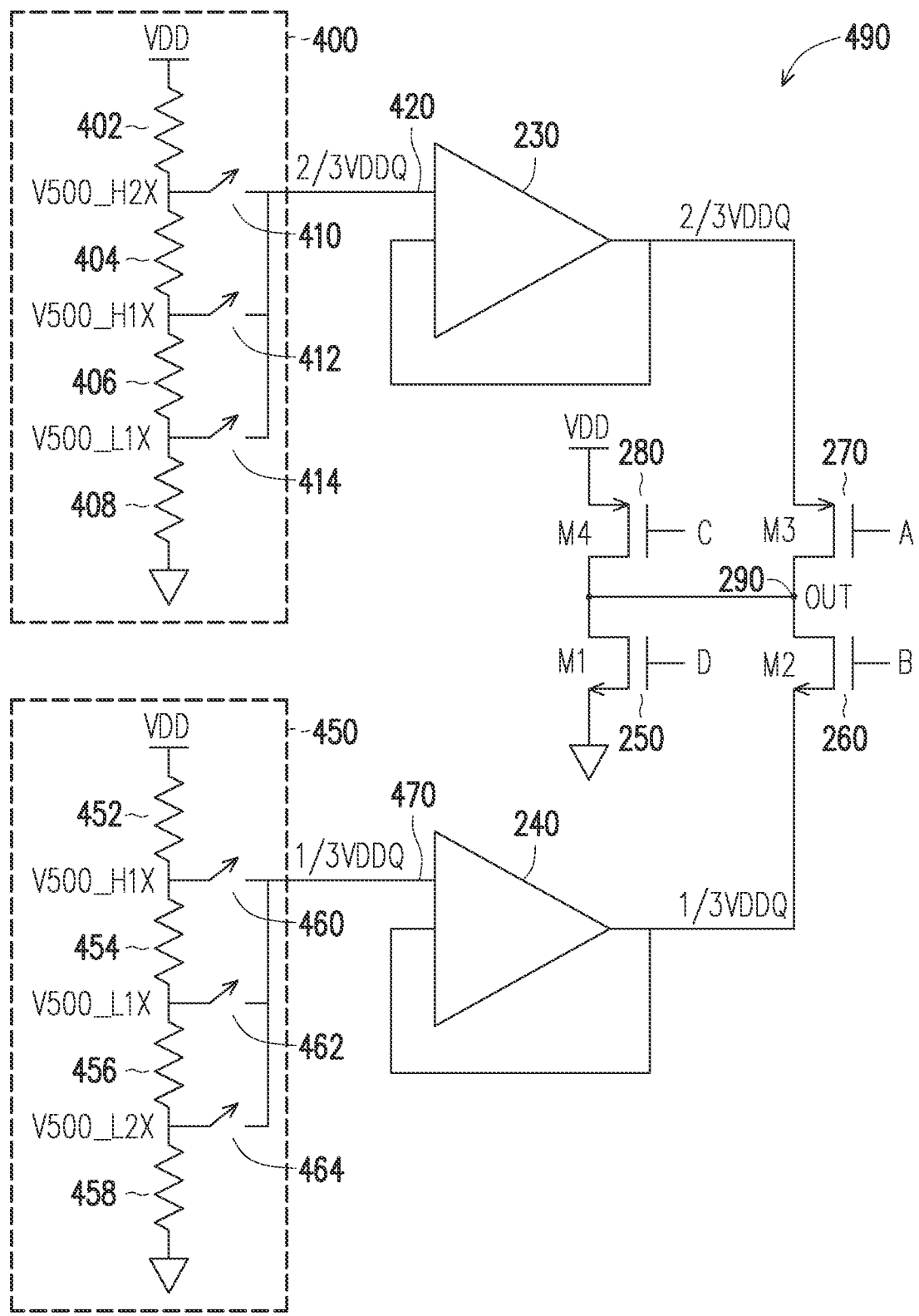
FIG. 4 is a schematic diagram illustrating another semiconductor device including local pre-positioning circuits in accordance with various embodiments of the present disclosure.

FIG. 4 is a schematic diagram illustrating another semiconductor device 490 including local pre-positioning circuits 400, 450 in accordance with various embodiments of the present disclosure. The pre-positioning circuit 400 locally adjusts the reference voltage input of high-speed buffer(s) 110 using a switched resistor ladder such as buffer 230. The pre-positioning circuit 450 locally adjusts the reference voltage input of high-speed buffer(s) 110 such as buffer 240 using a switched resistor ladder. In other words, each high-speed buffer(s) 110 such as buffers 230, 240 can have its own pre-positioning circuit 400, 450, respectively. The resistor ladder of pre-positioning circuit 400 can be made up of a plurality of resistors 402, 404, 406, 408 coupled together in series. A plurality of switches 410, 412, 414 can selectively couple the resistors 402, 404, 406, 408 to an input 420 of the high-speed buffer(s) 110 (e.g., buffer 230). For example, switch 410 can selectively couple a node between resistors 402, 404 to the reference voltage 420 (e.g., ⅔ VDD). Resistors 402, 404 can be sized appropriately to output a high voltage (e.g., represented by logic signal V500_H2X) relative to the other two combinations of resistors 402, 404 and 406, 408. Switch 412 can selectively couple a node between resistors 404, 406. Resistors 404, 406 can be sized appropriately to output an intermediate voltage (e.g. represented by logic signal V500_H1X) relative to the other two combinations of resistors 402, 404 and 406, 408. Switch 414 can selectively couple a node between resistors 406, 408. Resistors 406, 408 can be sized appropriately to output a low voltage (e.g., represented by logic signal V500_L1X) relative to the other two combinations of resistors 402, 404 and 404, 406.

Similarly, the resistor ladder of pre-positioning circuit 450 can be made up of a plurality of resistors 452, 454, 456, 458 coupled together in series. A plurality of switches 460, 462, 464 can selectively couple the resistors 452, 454, 456, 458 to an output 470 of the high-speed buffer(s) 110 (e.g., buffer 230). For example, switch 460 can selectively couple a node between resistors 452, 454 to the output 470 (e.g., ⅓VDD). Resistors 452, 454 can be sized appropriately to output a high voltage (e.g., represented by logic signal V250_H1X) relative to the other two combinations of resistors 452, 454 and 456, 458. Switch 462 can selectively couple a node between resistors 454, 456. Resistors 454, 456 can be sized appropriately to output an intermediate voltage (e.g., V250_L1X) relative to the other two combinations of resistors 452, 454 and 456, 458. Switch 464 can selectively couple a node between resistors 456, 458. Resistors 456, 458 can be sized appropriately to output a low voltage (e.g., V250_L2X) relative to the other two combinations of resistors 452, 454 and 456, 458.

The signals V500_H2X, V500_H1X, V500_L1X, V250_H1X, V250_L1X and V250_L2X are the logic control signals for switches 410, 412, 414, 460, 462, 464 respectively. The switches 410, 412, 414, 460, 462, 464 could be implemented as single MOSFETs or analog voltage pass-gates as appropriate to the resistor ladder voltages. For the purposes of explanation, the logic described in FIG. 5 assumes that the switch is closed when its corresponding logic control signal (e.g. V500_H2X) is a logic high. This could be implemented as logic high or low as needed depending on the types of switch being used for 410-464.

Figure 5:
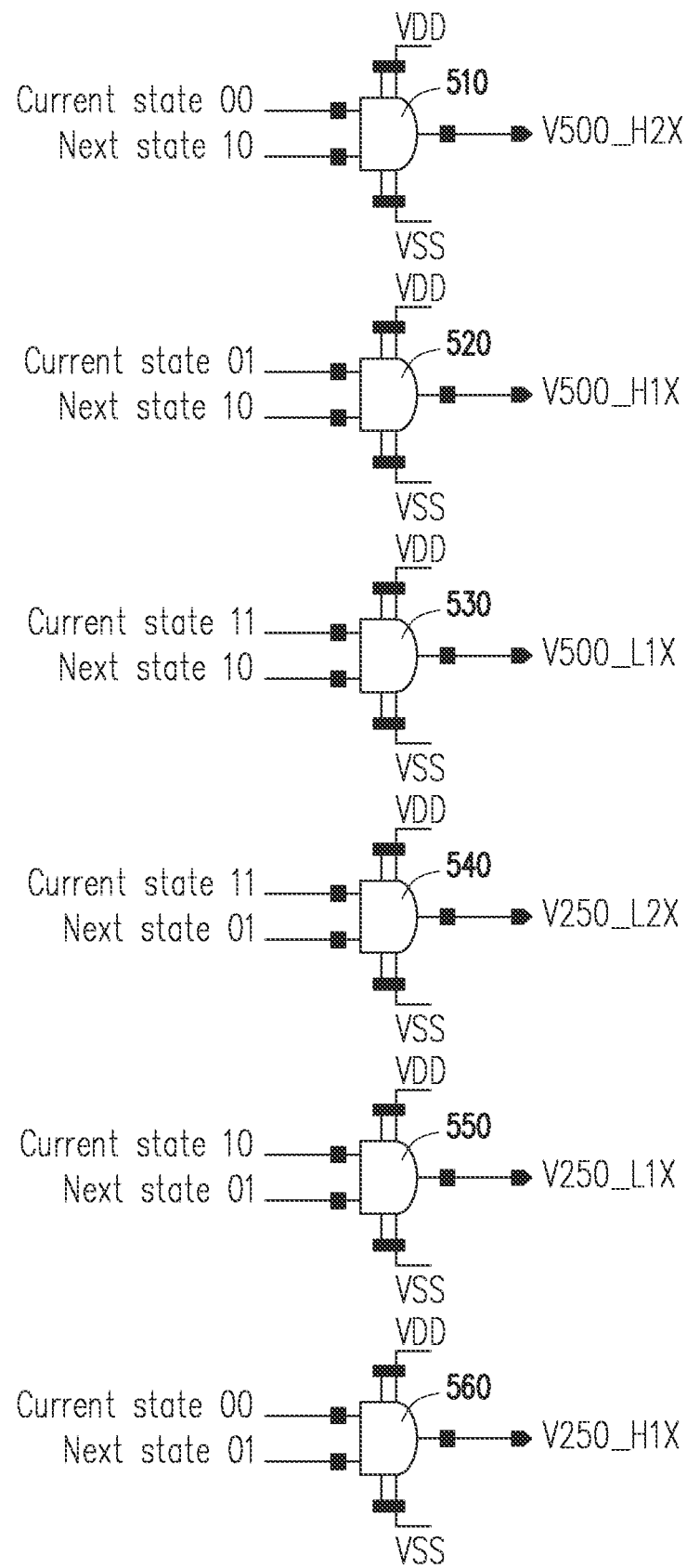
FIG. 5 is a schematic illustrating logic circuitry used to generate reference voltage levels for the pre-positioning circuitry in accordance with various embodiments of the present disclosure.

FIG. 5 is a schematic illustrating logic circuitry 510, 520, 530, 540, 550, 560 used to generate the logic control signals V500_H2X, V500_H1X, V500_L1X, V250_H1X, V250_L1X and V250_L2X for the pre-positioning circuitry 400, 450 in accordance with various embodiments of the present disclosure. Depending on the needs of a particular multi-channel input/output (I/O) data can be processed in many ways (e.g., buffered, multiplexed, first-in-first-out, modulated between clock domains, etc.) before it reaches the semiconductor device 100. With respect to pre-positioning using, for example, pre-positioning circuitry 300, 400, 450, logic control signals can be calculated based on logic circuitry 510, 520, 530, 540, 550, 560 using a current data state (e.g., 00, 01, 10 or 11) and a next data state (e.g., 01 or 10). For example, logic circuitry 510 can utilize inputs of a current state (e.g., 00) and a next state (e.g., 10) to output logic high or low voltage on output V500_H2X applied to pre-positioning circuitry 400. Logic circuitry 520 can utilize inputs of a current state (e.g., 01) and a next state (e.g., 10) to output logic high or low voltage on output V500_H1X applied to pre-positioning circuitry 400. Logic circuitry 530 can utilize inputs of a current state (e.g., 11) and a next state (e.g., 10) to output logic high or low voltage to output V500_L1X applied to pre-positioning circuitry 400. Logic circuitry 540 can utilize inputs of a current state (e.g., 11) and a next state (e.g., 01) to output logic high or low voltage to output V250_L2X applied to pre-positioning circuitry 450. Logic circuitry 550 can utilize inputs of a current state (e.g., 10) and a next state (e.g., 01) to output logic high or low voltage on output V250_L1X applied to pre-positioning circuitry 450. Logic circuitry 560 can utilize inputs of a current state (e.g., 00) and a next state (e.g., 01) to output logic high or low voltage on output V250_H1X applied to pre-positioning circuitry 450. Solely for the purpose of illustration and ease of understanding, logic circuitry 510, 520, 530, 540, 550, 560 of FIG. 5 include AND gates. One of ordinary skill in the art, however, can appreciate that any combination of logic elements resulting in the same output as an AND gate can be used for logic circuitry 510, 520, 530, 540, 550, 560 (e.g., inverted-input NOR gate and the like). The implementation described in FIG. 5 is merely one example of the logic decoder for a PAM-4 system that detects transitions to each of the two intermediate states. In a PAM-8 or higher system there would be more transitions to detect and hence more logic that still uses the present state and the next state to output an appropriate pre-positioning control signal to control the correct switch which anticipates the next transition to an intermediate state.

Figure 6A:
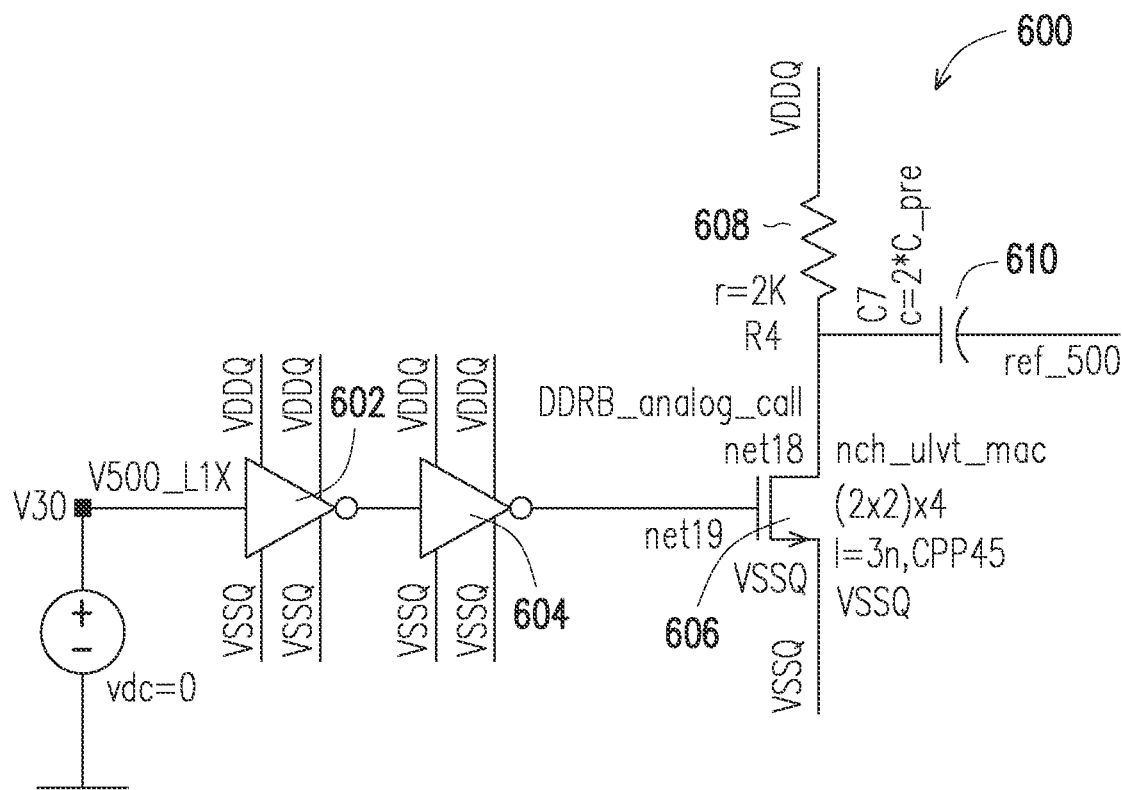
FIG. 6A is a schematic illustrating an exemplary fast-attack slow-decay circuit for generating reference voltages of the pre-positioning circuit in accordance with various embodiments of the present disclosure.

FIG. 6A is a schematic illustrating an exemplary fast-attack slow-decay circuit 600 for generating reference voltages of the pre-positioning circuit 400 in accordance with various embodiments of the present disclosure. Fast-attack slow-decay circuit 600 can momentarily raise or lower the reference voltage to the local high-speed buffer 110 (e.g., buffer 230). Fast-attack slow-decay circuit 600 can include inverters 602, 604, transistor 606, resistor 608, and capacitor 610. Inverters 602, 604 are coupled together in series, with an input of the logic control signal V500_L1X of logic control circuit 530. An output of inverter 604 is coupled to a gate terminal of inverter 606. A source/drain terminal of transistor 606 is coupled to a first terminal of resistor 608 and one plate of capacitor 610. The output of capacitor 610 could be coupled to net 420, the input to buffer 230. Fast-attack slow-decay circuit 600 includes an alternate or parallel method to implement the pre-positioning circuit 400 to the circuit represented in FIG. 4. The difference between the two implementations is that the pre-positioning circuit 400 of FIG. 4 introduces a change to voltage 420 that could last indefinitely whereas the fast-attack slow-decay circuit 600 of FIG. 6 produces a rapid change that dissipates over time and returns net 420 to its nominal voltage eventually. Depending on the expected operating conditions of the semiconductor device 100 and the load on its output the pre-positioning circuit 160 could be implemented as shown in FIG. 4 or in FIG. 6 or as a combination of both depending on whether the pre-positioning was compensation for DC errors in the output or more transient RC charging errors.

Figure 6B:
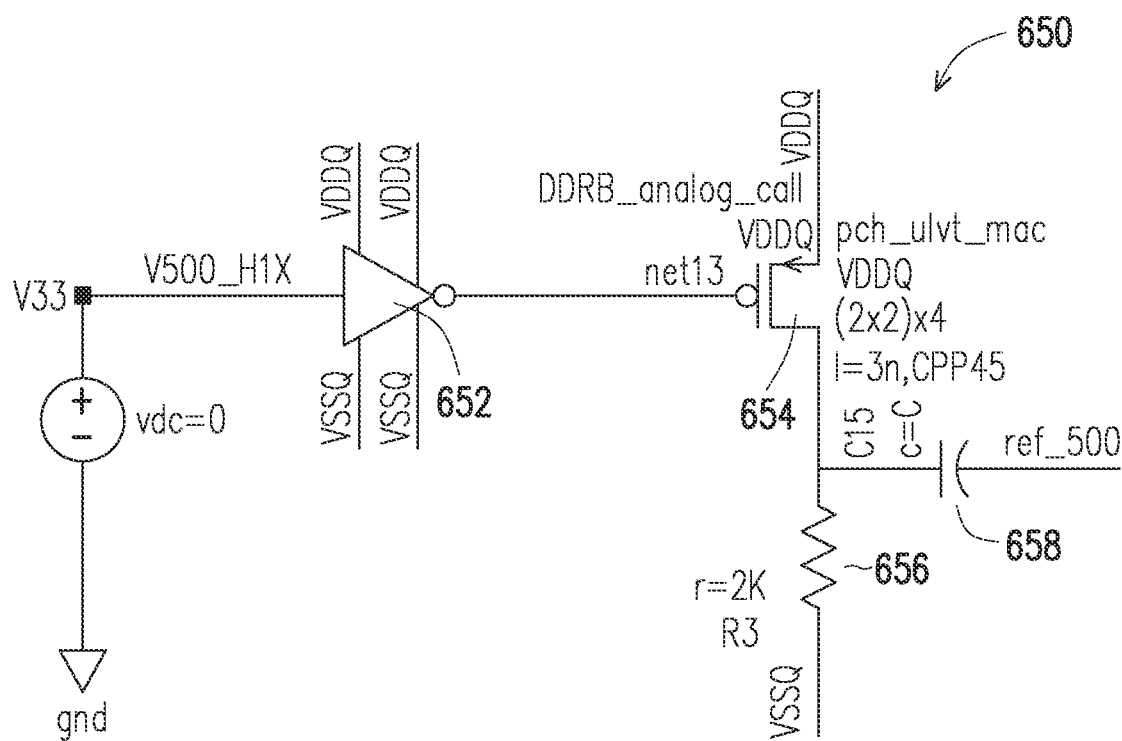
FIG. 6B is a schematic illustrating another exemplary fast-attack slow-decay circuit for generating reference voltages of the pre-positioning circuit in accordance with various embodiments of the present disclosure.

FIG. 6B is a schematic illustrating another exemplary fast-attack slow-decay circuit 650 for generating reference voltages of the pre-positioning circuit 400 in accordance with various embodiments of the present disclosure. Fast-attack slow-decay circuit 650 can momentarily raise or lower the reference voltage to the local high-speed buffer 110 (e.g., buffer 240). Fast-attack slow-decay circuit 650 can include inverter 652, transistor 654, resistor 656, and capacitor 658. Inverter 652 receives an input of the logic control signal V500_H1X of logic circuitry 520. An output of inverter 652 is coupled to a gate terminal of inverter 654. A source/drain terminal of transistor 654 is coupled to a first terminal of resistor 656 and one plate of capacitor 658. The output of capacitor 658 is coupled to net 420, the input to buffer 230. As in FIG. 4 there is a total of 6 circuits like fast-attack slow-decay circuit 650 and fast-attack slow-decay circuit 650 each controlled by one of the outputs of the logic control circuits in FIG. 5 to complete the implementation for PAM-4. Only two such examples are shown here for brevity. In higher PAM implementations such as PAM-8 or PAM-16, for example, each expected transition state requiring pre-positioning would have its own separate circuit like those in FIGS. 6A and 6B.

Figures 7A, 7B:
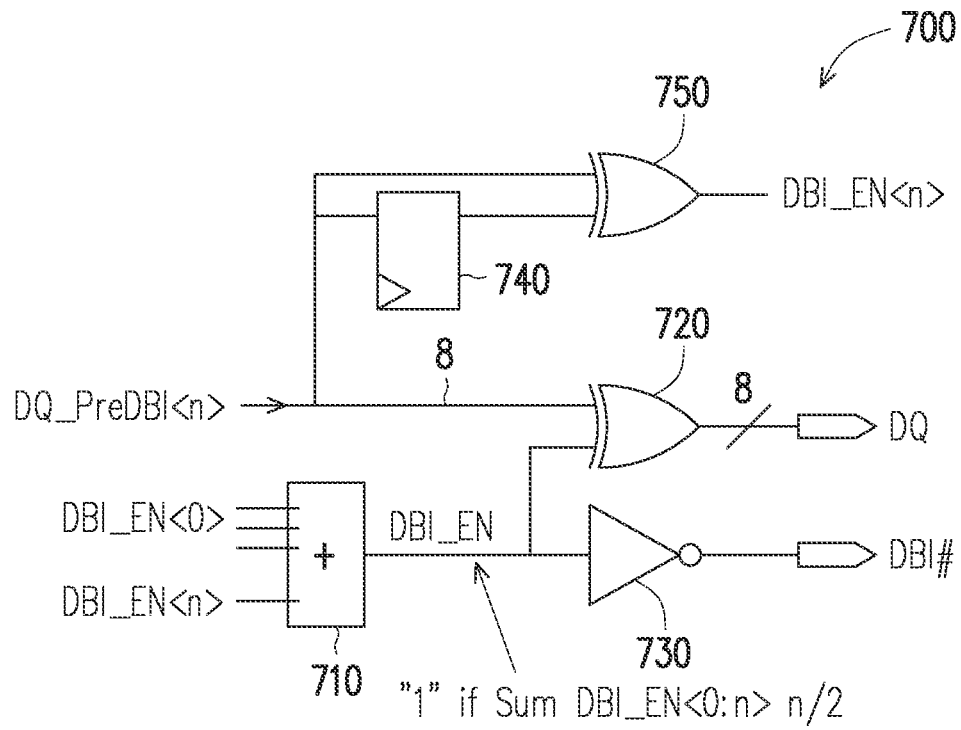
FIG. 7A is a schematic illustrating another exemplary semiconductor device incorporating a data bus inversion (DBI) enablement circuit for PAM-level signaling in accordance with various embodiments of the present disclosure.
FIG. 7B is a truth table illustrating the DBI encoding and corresponding data in accordance with various embodiments of the present disclosure.

FIG. 7A is a schematic illustrating another exemplary semiconductor device 700 incorporating a data bus inversion (DBI) enablement circuit 710 (e.g., high speed buffer 110) for PAM-level signaling in accordance with various embodiments of the present disclosure. Semiconductor device 700 includes a register 740 for aligning the previous data word and current data word, a DBI enablement circuit 710, high speed buffers 250 (not shown in FIG. 7A), which contains the high speed buffers 230 and 240, and logic gates 720, 730. The previous data word and the current data word can be N number of bits, in this example N=2, which is consistent with PAM-4 signaling, however, N can be any number of bits. Semiconductor device 700 relates to a scenario where the n number of channels is greater than one, such that there is more than one (1) channel connected to a power source.

In order to reduce a maximum high-speed buffer(s) 250 di/dt in any single clock cycle (e.g., rising or falling clock transition), the current data word can be used in conjunction with the previous data words to calculate a number of channels, n, which are causing a di/dt demand on each of the high-speed buffer(s) 230 and/or 240.

To determine the di/dt of each high speed buffer in 250, DBI enablement circuit 710 can be implemented using a multibit adder, that will be switching away from any of the voltage levels which do not correspond to each respective high speed buffer 230 and 240. DBI enablement circuit 710 may also include logic that compares the sum of the number of channels identified as switching away from voltage levels that do not correspond to each respective high speed buffer to a predetermined threshold to detect when the DBI logic should be applied to the current data word.

FIG. 8 is a truth table 800 illustrating based on the current data word and the previous data word, when to count the individual channel's di/dt for a given high speed buffer, in accordance with various embodiments of the present disclosure. This truth table is one such implementation.

For example, in a PAM-4 encoding scheme, each voltage rail corresponds uniquely to the most significant bit (MSB) or least significant bit (LSB). In order to minimize di/dt, when it is detected that more than approximately fifty percent (50%) of the channels will be switching to that particular high speed buffer's voltage rail, the corresponding data bit in the next word is inverted. By inverting the corresponding bit (e.g., LSB or MSB) of the current data word, the current data word is re-encoded such that the switching activity that was on the high speed buffer voltage rail is re-directed to a non-high speed buffer's rail. In doing so, the high speed buffer's rail will use a supply charge (e.g., electrical current) for a maximum of no more than approximately fifty percent (50%) of its connected channels (e.g., output drivers). A 4-level DBI bit is sent along with the next data to indicate that encoding scheme is used for each bit of the current data word. This allows the receive to unambiguously resolve the original data word before the inversion is applied.

Logic gate 720 and logic gate 750 is illustrated as a NOR gate, however, one of ordinary skill in the art can appreciate that logic gate 720 and logic gate 750 can be any combination of logic elements resulting in the same truth table as a NOR gate. Similarly, logic gate 730 is illustrated as an inverter, but can be any combination of logic elements resulting in the same truth table as an inverter.

FIG. 7B is a truth table illustrating the DBI encoding and corresponding data in accordance with various embodiments of the present disclosure. The 4-Level "DBI" bit is sent along with the current data word to indicate which encoding scheme is used for each bit of the data word, which is implemented by any combination of logic to implement the DBI function in DBI circuit 710. This allows the receiver to unambiguously resolve the original data word before the inversion is applied. For example, in scenario 752, when the MSB and the LSB of DBI circuit 710 are both set to logic lows (e.g., '0'), the next data for the MSB and LSB are not inverted. In scenario 754, when the MSB is set to a logic low (e.g., '0') and the LSB is set to a logic high (e.g., '1') for the DBI circuit 710, then the next data for the MSB is not inverted and the LSB is inverted. In scenario 756, when the MSB is set to a logic high (e.g., '1') and the LSB is set to a logic low (e.g., '0') for the DBI circuit 710, then the next data for the MSB is inverted and the LSB is not inverted. In scenario 758, when both the MSB and LSB of DBI circuit 710 are set to logic highs (e.g., '1'), then there is no next data output.

Solely for the purpose of illustration and ease of understanding, the semiconductor devices 700, 800 illustrated in FIGS. 7-8 utilize one (1) next data words (e.g., N=1). A person of ordinary skill in the art, however, can appreciate that the number of next data words can be any arbitrary number. Similarly, the semiconductor devices 700, 800 are explained using PAM-4 encoding, but a person of ordinary skill in the art can appreciate that any level of encoding scheme can be applied using the concepts described.

Figure 9:
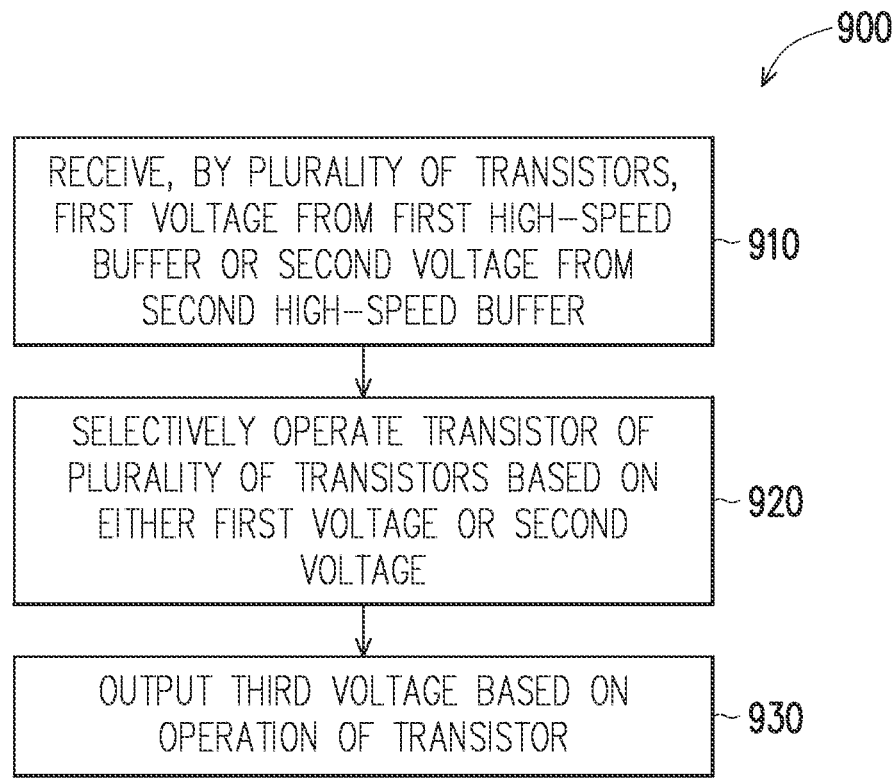
FIG. 9 is a process flow diagram illustrating method of minimizing or eliminating DC current in a semiconductor device in accordance with various embodiments of the present disclosure.

FIG. 9 is a process flow diagram 900 illustrating method of minimizing or eliminating DC current in a semiconductor device in accordance with various embodiments of the present disclosure. While FIG. 9 is described here with reference to previously described structures for ease in understanding, it is understood that the method applies to many other structures as well. A plurality of transistors (e.g., NMOS transistors 250, 260 and PMOS transistors 270, 280) receive, at step 910, a first voltage (e.g., ⅔VDD) from a first high-speed buffer (e.g., high-speed buffer 230) or a second voltage (e.g., ⅓VDD) from a second high-speed buffer (e.g., high-speed buffer 240) as described in detail relating to the operation of semiconductor device 200 of FIG. 2A. A transistor (e.g., one of NMOS transistor 250, 260 or PMOS transistor 270, 280) of a plurality of transistors (e.g., NMOS transistors 250, 260 and PMOS transistors 270, 280) selectively operates, at step 920, based on either the first voltage (e.g., ⅔VDD) or the second voltage (e.g., ⅓VDD) as described in detail in FIG. 2B. A third voltage (e.g., voltage at output 290) is output, at step 930, based on operation of the transistor (e.g., one of NMOS transistor 250, 260 or PMOS transistor 270, 280).

Use of the various circuits and methods as described herein can provide a number of advantages. For example, the semiconductor devices described herein do not contain DC components and in turn have minimal to no DC current flowing through them. Having minimal to no DC current, these semiconductor devices consume less power. Additionally, the use of local high-speed buffers (e.g., one per channel) facilitates multiple channel communication techniques, including but not limited to, PAM-4, PAM-8, or PAM-16. In PAM-8 or PAM-16 configurations, for example, there would be more pre-positioning states and more logic representing various transitions.

In one embodiment, a semiconductor device includes a first high-speed buffer configured to output a first voltage, a second high-speed buffer configured to output a second voltage, and a plurality of transistors coupled to the first high-speed buffer and the second high-speed buffer. At least one of the first voltage or the second voltage facilitates selective operation of a transistor of the plurality of transistors to output a third voltage.

In another embodiment, a method includes receiving, by a plurality of transistors, a first voltage from a first high-speed buffer or a second voltage from a second high-speed buffer. A transistor of a plurality of transistors is selectively operated based on either the first voltage or the second voltage. A third voltage is output based on operation of the transistor.

In yet another embodiment, a PAM driver includes a first high-speed buffer configured to output a first voltage, a second high-speed buffer configured to output a second voltage, a first pair of transistors coupled to the first high-speed buffer, and a second pair of transistors coupled to the second high-speed buffer. At least one of the first voltage or the second voltage facilitates selective operation of a transistor of the plurality of transistors to output a third voltage equivalent to either the first voltage or the second voltage for intermediate states of a PAM signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
 a first high-speed buffer configured to output a first voltage;
 a first pre-positioning circuit configured to provide the first high-speed buffer a first reference voltage;
 a second high-speed buffer configured to output a second voltage;
 a second pre-positioning circuit configured to provide the second high-speed buffer a second reference voltage different from the first reference voltage; and
 a plurality of transistors coupled to the first high-speed buffer and the second high-speed buffer, wherein at least one of the first voltage or the second voltage facilitates selective operation of a transistor of the plurality of transistors to output a third voltage.

2. The semiconductor device of claim 1, wherein the third voltage is equivalent to either the first voltage or the second voltage for intermediate states of a pulse amplitude modulation (PAM) signal.

3. The semiconductor device of claim 1, wherein the PAM signal is at least one of a 4-level PAM (PAM-4) signal, an 8-level PAM (PAM-8) signal, or a 16-level PAM (PAM-16) signal.

4. The semiconductor device of claim 1, wherein operation of the plurality of transistors using either the first voltage or the second voltage facilitates flow of the third voltage that is a non-transient voltage.

5. The semiconductor device of claim 1, wherein the plurality of transistors comprises:
    a first transistor including a first terminal configured to receive the first voltage and a second terminal connecting to an output node outputting the third voltage;
    a second transistor including a first terminal configured to receive the second voltage and a second terminal connecting to the output node;
    a third transistor including a first terminal configured to receive a fourth voltage and a second terminal connecting to the output node; and
    a fourth transistor including a first terminal configured to connect the ground and a second terminal connecting to the output node.

6. The semiconductor device of claim 1, wherein the first voltage is greater than the second voltage.

7. The semiconductor device of claim 1, wherein:
    the first pre-positioning circuit providing the first reference voltage to the first high-speed buffer based on a first preposition signal; and
    the second pre-positioning circuit providing the second reference voltage to the second high-speed buffer based on a second preposition signal.

8. The semiconductor device of claim 1, wherein at least one of the first pre-positioning circuit or the second pre-positioning circuit comprises at least one of a multiplexer or a logic circuit.

9. The semiconductor device of claim 1, wherein at least one of the first high-speed buffer or the second high-speed buffer comprises low dropout regulator (LDO).

10. The semiconductor device of claim 1, further comprising a data bus inversion (DBI) circuit coupled to the first high-speed buffer and the second high-speed buffer, the DBI circuit configured to output data indicating an encoding scheme used for each bit of a data word output by the plurality of transistors.

11. The semiconductor device of claim 1, wherein the first pre-positioning circuit or the second pre-positioning circuit comprises a resistor ladder coupled to the first high-speed buffer or the second high-speed buffer, the resistor ladder configured to generate the first reference voltage or the second reference voltage, respectively.

12. A method comprising:
    providing, by a first pre-positioning circuit, a first reference voltage to a first high-speed buffer;
    providing, by a second pre-positioning circuit, a second reference voltage different from the first reference voltage to a second high-speed buffer;
    receiving, by a plurality of transistors, a first voltage from the first high-speed buffer or a second voltage from the second high-speed buffer;
    selectively operating a transistor of the plurality of transistors based on either the first voltage or the second voltage; and
    outputting a third voltage based on operation of the transistor.

13. The method of claim 12, wherein the third voltage is equivalent to either the first voltage or the second voltage for intermediate states of a pulse amplitude modulation (PAM) signal.

14. The method of claim 12, wherein the PAM signal is at least one of a 4-level PAM (PAM-4) signal, an 8-level PAM (PAM-8) signal, or a 16-level PAM (PAM-16) signal.

15. The method of claim 12, wherein the selectively operating using either the first voltage or the second voltage facilitates flow of the third voltage that is a non-transient voltage.

16. The method of claim 12, wherein the plurality of transistors comprises:
    a first transistor including a first terminal configured to receive the first voltage and a second terminal connecting to an output node outputting the third voltage;
    a second transistor including a first terminal configured to receive the second voltage and a second terminal connecting to the output node;
    a third transistor including a first terminal configured to receive a fourth voltage and a second terminal connecting to the output node; and
    a fourth transistor including a first terminal configured to connect the ground and a second terminal connecting to the output node, wherein the first voltage is greater than the second voltage.

17. The method of claim 12, wherein the third voltage indicates an encoding scheme used for each bit of a data word output by the plurality of transistors, a data bus inversion (DBI) circuit coupled to the first high-speed buffer and the second high-speed buffer, the DBI circuit configured to output data.

18. The method of claim 12, further comprising generating, by a resistor ladder of the first pre-positioning circuit or the second pre-positioning circuit, the first reference voltage or the second reference voltage, respectively.

19. A pulse amplitude modulation (PAM) driver comprising:
    a first high-speed buffer configured to output a first voltage;
    a first pre-positioning circuit configured to provide the first high-speed buffer a first reference voltage;
    a second high-speed buffer configured to output a second voltage;
    a second pre-positioning circuit configured to provide the second high-speed buffer a second reference voltage different from the first reference voltage;
    a first transistor coupled to the first high-speed buffer;
    a second transistor coupled to the second high-speed buffer,
    wherein at least one of the first voltage or the second voltage facilitates selective operation of a transistor of a plurality of transistors to output a third voltage equivalent to either the first voltage or the second voltage for intermediate states of a PAM signal.

20. The PAM driver of claim 19, wherein operation of the first transistor or the second transistor using either the first voltage or the second voltage facilitates flow of the third voltage that is a non-transient voltage.

* * * * *